United States Patent [19]

Lee et al.

[11] Patent Number: 5,468,669
[45] Date of Patent: Nov. 21, 1995

[54] INTEGRATED CIRCUIT FABRICATION

[75] Inventors: Kuo-Hua Lee, Wescosville, Pa.; Horng-dar Lin; Ran-Hong Yan, both of Holmdel, N.J.; Chen-Hua D. Yu, Allentown, Pa.

[73] Assignee: AT&T Corp., Murray Hill, N.J.

[21] Appl. No.: 145,272

[22] Filed: Oct. 29, 1993

[51] Int. Cl.⁶ ................. H01L 21/253; H01L 21/335
[52] U.S. Cl. ............. 437/51; 437/56; 437/192; 437/193; 437/200; 437/956; 148/DIG. 20
[58] Field of Search ................ 437/195, 200, 437/56, 57, 52, 192, 193, 190, 956; 148/DIG. 147, DIG. 20

[56] References Cited

U.S. PATENT DOCUMENTS

| | | | |
|---|---|---|---|
| 4,463,491 | 8/1984 | Goldman et al. | 437/200 |
| 4,555,842 | 12/1985 | Levinstein et al. | 437/56 |
| 4,931,411 | 6/1990 | Tigelaar et al. | 437/192 |
| 4,977,102 | 12/1990 | Ema | 437/52 |

OTHER PUBLICATIONS

Wolf, Silicon Processing, Lattice Press, 1990, vol. 2, pp. 587–593, 623–635.
Wolf, Silicon Processing, Lattice Press, 1986, vol. 1, pp. 384–386.

*Primary Examiner*—T. N. Quach
*Attorney, Agent, or Firm*—John T. Rehberg

[57] ABSTRACT

A semiconductor integrated circuit, and process for its manufacture, are disclosed which contains both $n^+$ and $p^+$ gates that do not pose a risk of dopant interdiffusion. Both $n^+$ and $p^+$ gates may be fabricated by conventional means. The gate structures are severed over the tub boundaries. A titanium nitride interconnective layer is deposited and patterned over the gates. The interconnective layer preserves connectivity between the $n^+$ and $p^+$ gates without risk of deleterious dopant interdiffusion.

6 Claims, 2 Drawing Sheets

INTEGRATED CIRCUIT FABRICATION

TECHNICAL FIELD

This invention relates to methods for semiconductor integrated circuit fabrication and to semiconductor integrated circuits.

BACKGROUND OF THE INVENTION

Many CMOS integrated circuits utilize $n^+$ gate material for both PMOS and NMOS devices. However, as gate lengths shrink, there is an increasing trend to the use of $p^+$ gates for both PMOS and NMOS devices. PMOS transistors with $p^+$ gates (i.e., surface channel devices) exhibit good short channel performance, threshold voltages, and sub-threshold swings which are less dependent upon channel length than PMOS devices with $n^+$ (i.e., buried channel devices) gates. NMOS transistors with $p^+$ gates have also been found satisfactory in various CMOS applications.

Some CMOS integrated circuits may utilize both $n^+$ and $p^+$ gates.

However, when a gate having an $n^+$ doped region is in contact with a gate having a $p^+$ doped region, interdiffusion of the dopants may occur, and there is an associated loss of control of the work function. The problem is expected to occur, for example, at those locations where a gate crosses a tub boundary. That portion of the gate over the p tub may be doped n+, while that potion of what is materially the same gate may be doped $p^+$ over the n tub.

Some manufacturers have attempted to solve the problem by capping a continuous gate runner with a titanium nitride conductor, thus preserving conduction across the tub boundary should interdiffusion occur. However, with this approach, there is still a need to limit the thermal processing budget to retard the possibility of interdiffusion.

SUMMARY OF THE INVENTION

The present invention alleviates this problem by, illustratively, forming a dielectric layer over a substrate and forming a first conductive layer over the dielectric layer. An opening is formed in the conductive layer. Then a second conductive layer is formed overlying the first conductive layer. The first and second conductive layers are patterned together to form two gates which are electrically connected by the second conductor and not the first conductor.

DETAILED DESCRIPTION

Figure 1:
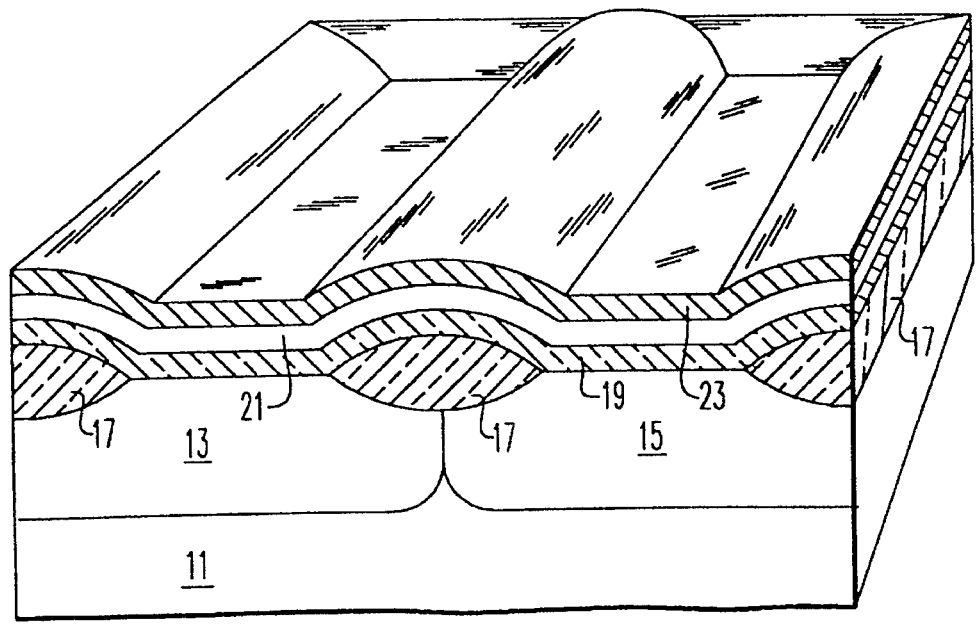
FIGS. 1, 2 and 4 are partially perspective, partially cross-sectional views depicting an illustrative embodiment of this invention.

In FIG. 1, reference numeral 11 denotes a substrate which may be silicon, doped silicon, epitaxial silicon, etc. In general, the term substrate is used herein to denote a material upon which other materials may be deposited or formed. Reference numeral 13 denotes a p tub, while reference numeral 15 denotes an n tub. As will be appreciated by those of ordinary skill in the art, the invention is also applicable to single tub CMOS devices and processes. Reference numeral 17 denotes a field oxide.

After definition and formation of field oxide 17, a gate oxide layer 19 having a thickness of approximately 100 Å is grown. Next, a polysilicon layer 21, illustratively having a thickness of approximately 1000 Å, is deposited atop gate oxide 19. Finally, a refractory metal silicide layer, illustratively tungsten silicide, is formed (typically by sputtering) atop polysilicon layer 21. Reference numeral 23 denotes the silicide layer. That portion of polysilicon layer 21 over p tub 13 is doped with n type dopants; that portion of polysilicon layer 21 over n tub 15 is doped with p type dopant. A variety of techniques may be utilized to perform the doping procedure. For example, before formation of the silicide, a resist may be patterned covering the polysilicon over one of the tubs, and the exposed polysilicon doped by ion implantation.

A preferred method of doping polysilicon layer 21 is to wait until after formation of the silicide 23. Then the silicide 23 is masked and appropriate dopants injected into the silicide by ion implantation. Later, the dopants are driven out of the silicide 23 into the underlying polysilicon 21.

Figure 2:
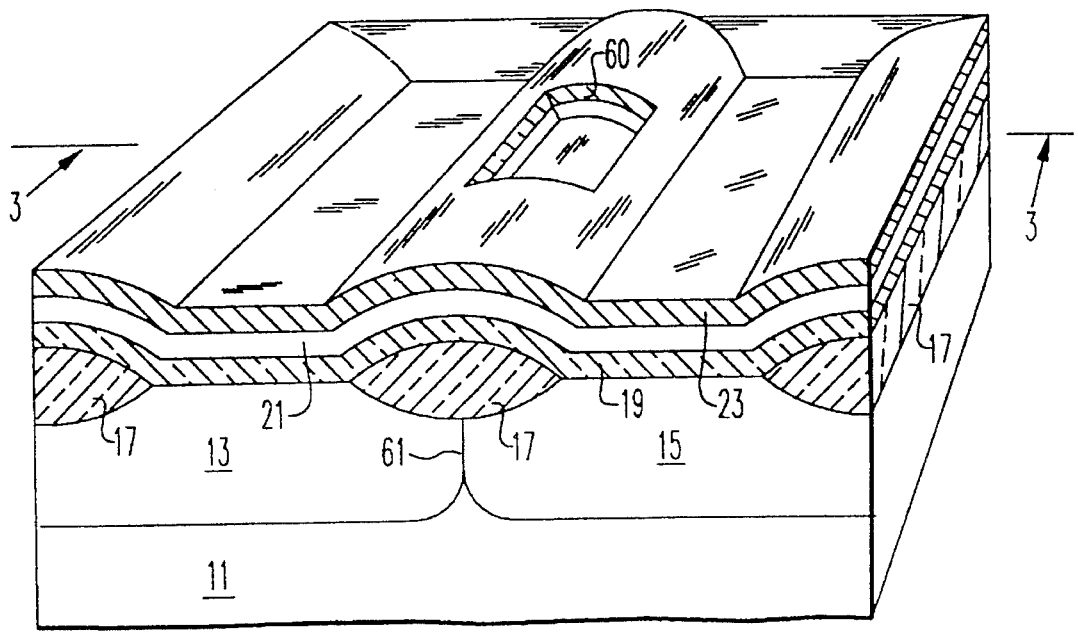

After the blanket deposition of layers 19, 21 and 23, an opening 60 shown in FIG. 2 is created over field oxide 17 straddling the boundary 61 between tubs 13 and 15. Opening 60 may be created by conventional photolithography including etching of layers 19, 21 and 23 to expose the top of field oxide 17.

Figure 3:
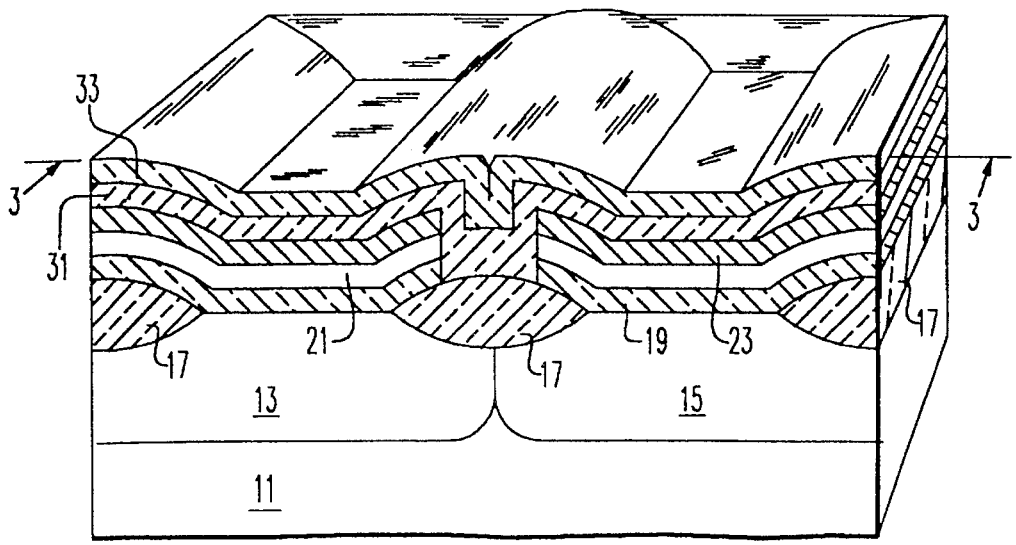
FIG. 3 is a partially perspective, partially cross-sectional view of FIG. 2 taken along the line 3—3 further including conductive layers.

Next, referring to the cross-sectional view of FIG. 3, a blanket layer 31 of, for example, titanium nitride (or another material with sufficiently low sheet resistance and low diffusivity) is deposited. Layer 31 is desirably covered by a material suitable for hard mask etching, illustratively a dielectric such as plasma enhanced TEOS, for example, layer 33.

Figure 4:
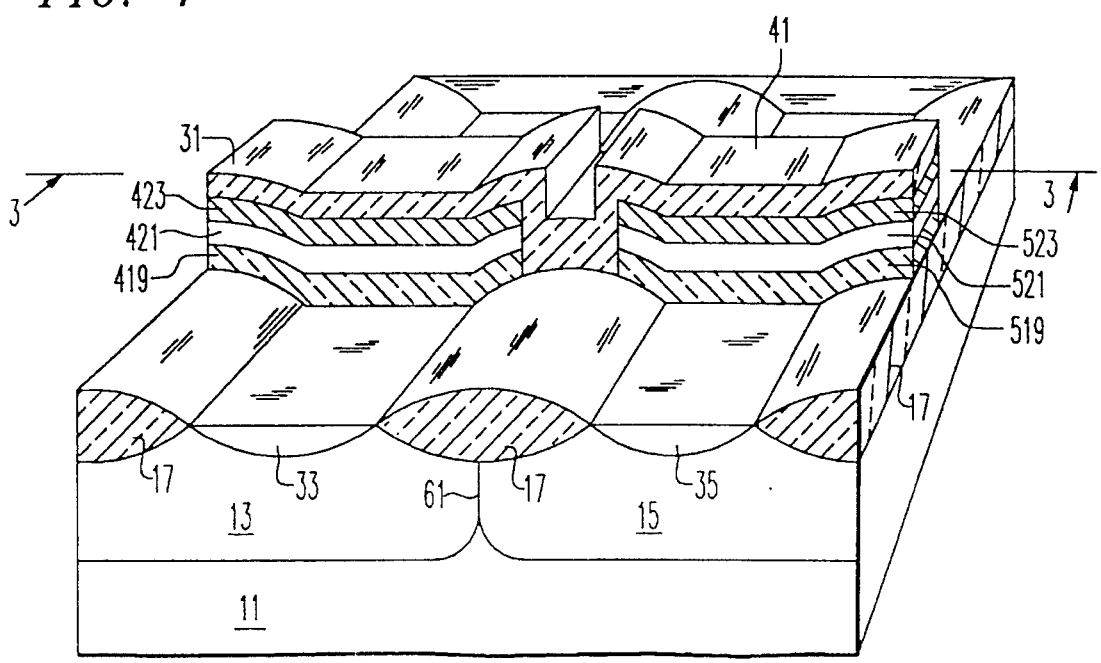

Next, referring to FIG. 4, using layer 33 as a hard mask (although other photolithography processes may also be used), gate 41 in FIG. 4 is defined. (For example, layer 33 may be etched through a patterned photoresist. Then, using patterned dielectric 33 as a hard mask, the underlying layers 31, 23, 21 and 19 are etched.) The mask used to create gate 41 is aligned with opening 60 so that polysilicon 521 does not contact polysilicon 421.

Gate 41 has polysilicon layer 421 which is $n^+$ doped over p tub 13 and polysilicon layer 521 which is $p^+$ doped over n tub 15. As mentioned before, the etching process is aligned and performed so that there is no material continuity between polysilicon layer 421 and polysilicon layer 521 (or between oxides 419 and 519 or between silicides 423 and 523).

It will be seen from an examination of FIG. 4 that layer 31 effectively preserves electrical continuity between $n^+$ polysilicon layer 421 and p+ polysilicon layer 521 without permitting interdiffusion of n and p type dopants. $N^+$ polysilicon layer 421 is separate from $p^+$ layer 521 (due to the creation of opening 60 earlier in FIG. 2).

Illustratively, subsequent processing may involve formation of junctions 33 and 35 by ion implantation or other means. Subsequent semiconductor integrated circuit processing such as dielectric deposition and runner formation may then be performed.

We claim:

1. A method of integrated circuit fabrication comprising:

forming a dielectric layer overlying a substrate;

forming a first conductive layer over said dielectric layer;

forming an opening in said conductive layer;

forming a second conductive layer overlying said first conductive layer;

patterning said first and second conductive layers together to form first and second gates, said gates being electrically connected to each other by said second conductive layer and not connected by said first conductive layer;

and further in which said substrate has an n tub and a p tub, there being a boundary between said tubs and in which said opening overlies said boundary.

2. The method of claim 1 in which a field oxide is formed between said substrate and said dielectric layer.

3. The method of claim 1 in which said first conductive layer is polysilicon.

4. The method of claim 1 in which said second conductive layer is titanium nitride.

5. The method of claim 1 in which a layer of a refractory metal silicide is formed between said first and second conductive layers and patterned together with them.

6. A method of integrated circuit fabrication comprising:

forming an n tub and a p tub in a silicon substrate; there being layer a boundary between said tubs;

forming a field oxide over said boundary;

forming a blanket oxide layer over said substrate;

forming a blanket polysilicon layer contacting said oxide layer, whereby that portion of said polysilicon layer overlying said n tub is p-type and that portion of said polysilicon layer overlying said p tub is n-type;

forming a blanket tungsten silicide layer contacting said polysilicon layer;

forming an opening through at least said tungsten silicide layer and said polysilicon layer, exposing oxide, said opening having sides and a bottom;

forming a blanket layer of titanium nitride contacting said layer of tungsten silicide and contacting said sides and bottom of said opening, patterning said titanium nitride layer and said tungsten silicide layer and said polysilicon layer and said oxide layer together whereby that portion of said polysilicon layer overlying said n tub is severed from that portion of said polysilicon layer overlying said p tub and that portion of said tungsten silicide layer overlying said n tub is severed from that portion of said tungsten silicide layer overlying said p tub;

and further whereby said titanium nitride layer maintains electrical conduction between the said severed portions of said polysilicon layer and said tungsten silicide layer.

\* \* \* \* \*